(12) United States Patent
Yoshikuni

(10) Patent No.: US 6,940,148 B2
(45) Date of Patent: Sep. 6, 2005

(54) SEMICONDUCTOR DEVICE CAPABLE OF ADJUSTING INPUT RESISTANCE WITHOUT CHANGING INPUT TERMINAL CAPACITANCE

(75) Inventor: Hitoshi Yoshikuni, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 30 days.

(21) Appl. No.: 10/777,188

(22) Filed: Feb. 13, 2004

(65) Prior Publication Data

US 2004/0159941 A1 Aug. 19, 2004

(30) Foreign Application Priority Data

Feb. 17, 2003 (JP) ........................................ 2003-038088

(51) Int. Cl.[7] .............................................. H01L 29/00
(52) U.S. Cl. ..................................... 257/532; 257/692
(58) Field of Search ........................................ 257/532

(56) References Cited

U.S. PATENT DOCUMENTS 5,847,451 A * 12/1998 Ohtaki et al. ............... 257/697
6,417,557 B1 * 7/2002 Haruki ......................... 257/532
6,794,098 B1 * 9/2004 Kubacki ......................... 430/9

FOREIGN PATENT DOCUMENTS

| JP | 62-291213 | 12/1987 |
| --- | --- | --- |
| JP | 3-138962 | 6/1991 |
| JP | 4-98685 | 3/1992 |
| JP | 9-102728 | 4/1997 |
| JP | 2000-31386 | 1/2000 |
| JP | 3292175 | 3/2002 |
| JP | 2002-222918 | 8/2002 |

* cited by examiner

Primary Examiner—Douglas A. Wille
(74) Attorney, Agent, or Firm—Young & Thompson

(57) ABSTRACT

A semiconductor device is capable of adjusting an input resistance without changing an input terminal capacitance. The capacitance formed by a capacitive wiring and a comb-shaped wiring can be adjusted by changing the length of the capacitive wiring. The resistance between the capacitive wiring and the ground potential can be adjusted by changing the positions of contacts which interconnect the capacitive wiring and a resistive wiring. Since the resistance can be adjusted simply by changing the connections of the contacts, only the input resistance can be adjusted without changing the input terminal capacitance.

4 Claims, 5 Drawing Sheets

SEMICONDUCTOR DEVICE CAPABLE OF ADJUSTING INPUT RESISTANCE WITHOUT CHANGING INPUT TERMINAL CAPACITANCE

BACKGROUND OF THE INVENTION

1. Field of the Invention

The present invention relates to a semiconductor device such as a DRAM (Dynamic Random Access Memory) or the like which is required to operate at high speed, and more particularly to a semiconductor device having a capability for adjusting propagation speed variations between terminals thereof.

2. Description of the Related Art

Semiconductor devices such as DRAMs exchange data with an external controller by way of input signal lines including a data signal line, a control signal line, a clock signal line, etc. Therefore, if a skew, which represents the difference between the propagation speeds of input signals between terminals or devices, becomes large, then such semiconductor devices tend to suffer operational drawbacks. In particular, as the speed of operation of semiconductor devices such as DRAMs is becoming higher in recent years, there is a tendency to establish stricter standards for ranges of variations of input terminal capacitances which represent capacitances between input terminals and the ground potential. In view of such a trend, there has been proposed a semiconductor device having a circuit for adjusting an input terminal capacitance as disclosed in Japanese laid-open patent publication No. 2000-31386, for example.

Such a conventional semiconductor device is illustrated in FIG. 1 of the accompanying drawings. As shown in FIG. 1, input terminal capacitance adjusting device 20 is connected by a connection switching aluminum wiring to a line which connects electrostatic-breakdown-prevention input protection resistor 40 connected to input terminal (bonding pad) 10 and internal circuit 30. Input terminal capacitance adjusting device 20 comprises a plurality of MOS-type capacitive elements 21 each comprising a MOS (Metal Oxide Semiconductor) transistor. The conventional semiconductor device illustrated in FIG. 1 adjusts an input terminal capacitance by changing the pattern of the connection switching aluminum wiring to change connections of MOS-type capacitive elements 21.

However, since MOS-type capacitive elements 21 each comprising a MOS transistor have large junction resistances (Rj) which are resistances between itself and the ground potential, a resistive component thereof increases a the time a capacitance is added, resulting in an increase in an input resistance (Ri).

An equivalent circuit of the conventional semiconductor device illustrated in FIG. 1 after it has adjusted the input terminal capacitance is shown in FIG. 2 of the accompanying drawings.

The capacitance between bonding pad 10 and the ground potential is made up of various capacitances including a PAD capacitance of bonding pad 10, an wiring capacitance of the wiring ranging from bonding pad 10 to protection resistance 40, a diffusion layer capacitance of an output transistor, an wiring capacitance of an internal wiring following protection resistance 40, and other capacitances. Junction resistances (Rj) exist between those capacitances and the ground potential.

Input terminal capacitance (Ci) at the input terminal represents the sum of all capacitances (Cj) connected to the input terminal. The propagation speed is affected by not only the input terminal capacitance, but also the magnitudes of junction resistances (Rj) exist between the capacitances and the ground potential. Therefore, some standards established in recent years include not only standards for input terminal capacitance (Ci), but also standards for input resistance (Ri). Input resistance (Ri) is of a value calculated by weighting junction resistances (Rj) based on the magnitudes of capacitances (Cj) connected thereto and adding the weighted junction resistances.

The values of input terminal capacitance (Ci) and input resistance (Ri) have to fall within ranges according to standards that are stricter for higher-speed semiconductor devices.

For example, for RAMBUS (registered trademark) DRAMs (hereinafter referred to as "RDRAMs"), it has been stipulated that variations of input terminal capacitances (Ci) between terminals be equal to or less than 60 fF (femtofarad) and input resistance (Ri) be in the range from 4 to 10 Ω.

The RDRAM is a DRAM according to a RAMBUS interface for carrying out a data transfer process that has been developed by Rambus, Inc., U.S.A., and is capable of high-speed data transmission.

A typical arrangement of a system using RDRAMs is shown in FIG. 3 of the accompanying drawings. In the system, controller (master) 50 having a RAMBUS interface and a plurality of RDRAMs (slaves) 60₁ through 60ₙ are interconnected by bus wirings called RAMBUS channels. The RAMBUS channels comprise high-speed small-amplitude signal lines connected to a terminal power supply through resistors equivalent to the impedance of transmission lines. High-speed signals include two clock signals which comprise a CTM (Clock To Master) signal as a clock signal supplied to controller 50 and a CFM (Clock From Master) signal as a clock signal returned from controller 50 to RDRAMs 60₁ through 60ₙ.

Since at most 32 RDRAMs are connected per channel, clock signals are connected to a total of 64 pins TCLK, RCLK. The CFM signal which is input to the endmost RDRAM is connected to the 64th pin.

With the system thus arranged, if input resistance (Ri) is large, then the clock waveform which has initially had an amplitude of 0.8 V is attenuated by input resistance (Ri) of each pin, and has its amplitude reduced when it is input to the endmost RDRAM. For the clock signal is input to the endmost RDRAM to have a sufficient amplitude, input resistance (Ri) at each terminal needs to be reduced. In applications where higher frequencies are involved, input resistance (Ri) needs to be smaller as the amplitude itself is required to be smaller.

From the standpoint of the attenuation of signals, the input resistance should be held to a minimum value. However, if the input resistance is excessively small, then it causes a large overshoot due to the inductance of the package side.

Accordingly, it is necessary that the value of the input resistance be kept in a certain range. According to the present RAMBUS specifications, the input resistance should be held in the range from 4 to 10 Ω as described above.

With the above conventional semiconductor device, because the input terminal capacitance is adjusted using the MOS-type capacitive elements, the input resistance is also changed when the input terminal capacitance is adjusted. To alleviate such a shortcoming, it has been proposed to construct a capacitive component using a comb-shaped wiring pattern for the purpose of adjusting the input terminal capacitance while minimizing any changes in the input resistance, as disclosed in Japanese patent No. 3292175 and Japanese laid-open patent publication No. 62-291213.

An arrangement of a semiconductor device whose capacitive component is constructed using a comb-shaped wiring is shown in FIG. 4 of the accompanying drawings.

As shown in FIG. 4, the semiconductor device has input terminal 10 partly constructed of a comb-shaped wiring having successive cavities and fingers at constant spaced intervals. The semiconductor device also has a GND (ground) wiring having fingers positioned in the respective cavities of the comb-shaped wiring in an interdigitating fashion. Since the GND wiring is connected to the ground potential, capacitive components are constructed by an electrostatic coupling between the comb-shaped wiring and the GNG wiring. The magnitude of the capacitance of input terminal 10 can be adjusted by adjusting the length of the GND wiring.

With the semiconductor device using the above comb-shaped wiring, any production process for changing the capacitance can be minimized because the input terminal capacitance can be adjusting simply by changing the uppermost-level wiring. Furthermore, inasmuch as the capacitive element is formed of only wirings, any resistive component that is increased by adjusting the capacitive element can be reduced, making it possible to adjust the input terminal capacitance while minimizing an increase in the input resistance. In addition, as an inhibitive region around the pad can effectively be utilized, an increase in the area of the circuit for adjusting the input terminal capacitance can be held to a minimum.

However, though the conventional semiconductor device using the above comb-shaped wiring is capable of adjusting input terminal capacitance (Ci), it is unable to adjust input resistance (Ri). Therefore, it has been difficult to satisfy standards for both input terminal capacitance (Ci) and adjust input resistance (Ri).

SUMMARY OF THE INVENTION

It is an object of the present invention to provide a semiconductor device which is capable of adjusting an input terminal capacitance and an input resistance independently of each other and of adjusting the input resistance without changing the input terminal capacitance.

To achieve the above object, there is provided in accordance with the present invention a semiconductor device having a plurality of input terminals, comprising a comb-shaped wiring disposed around a bonding pad which serves as each of the input terminal, at the same potential as the bonding terminal, the comb-shaped wiring having cavities and fingers at constant spaced intervals, a capacitive wiring disposed in facing relation to the comb-shaped wiring and having fingers positioned respectively in the cavities of the comb-shaped wiring in an interdigitating fashion, and a resistive wiring disposed underneath the capacitive wiring and connected to the capacitive wiring by a plurality of contacts, the resistive wiring having ends connected to a ground potential.

With the above arrangement, the capacitance formed by the capacitive wiring and the comb-shaped wiring can be adjusted by changing the length of the capacitive wiring, and the resistance between the capacitive wiring and the ground potential can be adjusted by changing the positions of the contacts which interconnect the capacitive wiring and the resistive wiring. Consequently, the resistance can be adjusted simply by changing the connections of the contacts, and only the input resistance can be adjusted without changing the input terminal capacitance.

According to the present invention, there is also provided a semiconductor device having a plurality of input terminals, comprising a comb-shaped wiring disposed around a bonding pad which serves as each of the input terminal, at the same potential as the bonding terminal, the comb-shaped wiring having cavities and fingers at constant spaced intervals, a capacitive wiring disposed in facing relation to the comb-shaped wiring and having fingers positioned respectively in the cavities of the comb-shaped wiring in an interdigitating fashion, a resistive wiring disposed in a lower layer outside of a position where the capacitive wiring is disposed, and connected by a plurality of contacts to a layer in which the bonding pad is disposed, the resistive wiring having ends connected to a ground potential, and joint wirings interconnecting the contacts and the capacitive wiring in the layer in which the bonding pad is disposed.

With the above arrangement, the capacitance formed by the capacitive wiring and the comb-shaped wiring can be adjusted by changing the length of the capacitive wiring, and the resistance between the capacitive wiring and the ground potential can be adjusted by changing the positions where the joint wirings which interconnect the capacitive wiring and the resistive wiring are connected. Consequently, the resistance can be adjusted simply by changing the connections of the contacts, and only the input resistance can be adjusted without changing the input terminal capacitance. Because the resistance can be changed without changing a contact pattern of the contacts, the values of both an input terminal capacitance and an input resistance can be adjusted simply by changing an wiring pattern.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 5:
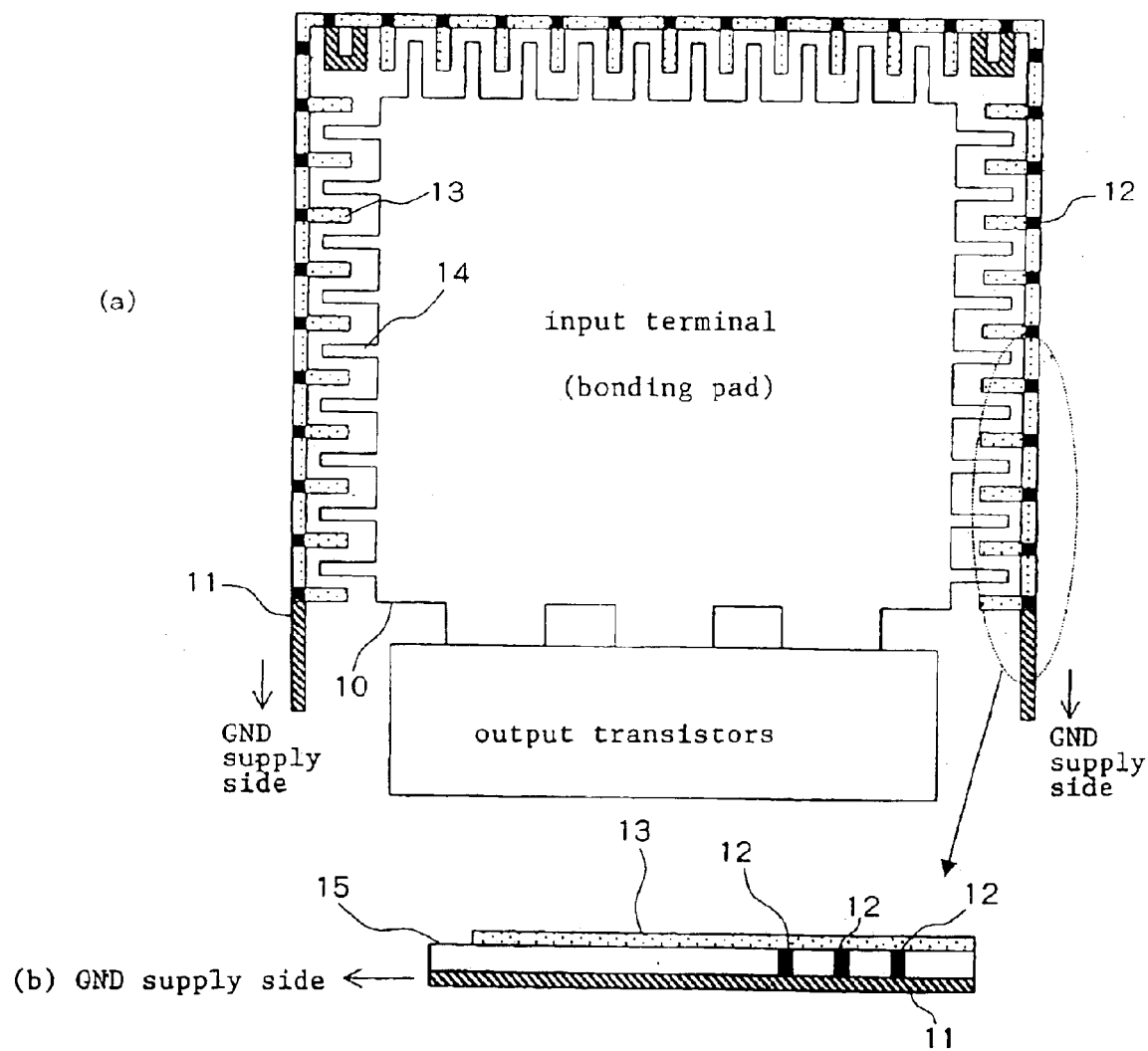
FIGS. 5(a) and 5(b) are views showing an wiring pattern of a semiconductor device according to a first embodiment of the present invention.

1st Embodiment:

FIGS. 5(a) and 5(b) show an wiring pattern of a semiconductor device according to a first embodiment of the present invention. FIG. 5(a) is a plan view showing the wiring pattern of the semiconductor device, and FIG. 5(b) is a cross-sectional view of a portion, encircled by the broken line, of the semiconductor device shown in FIG. 5(a).

Figure 1:
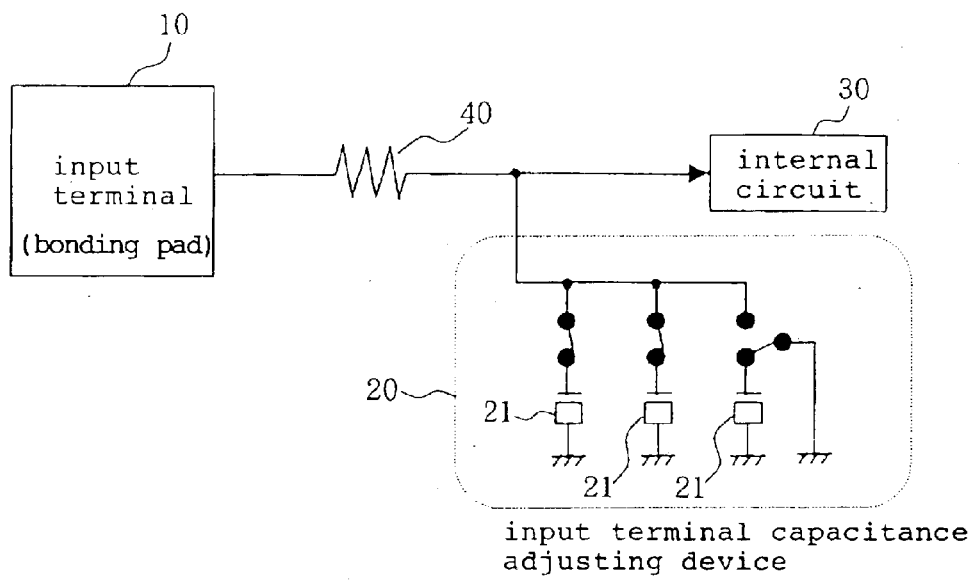
FIG. 1 is a diagram showing an arrangement of a conventional semiconductor device having a circuit for adjusting an input terminal capacitance.
Figure 2:
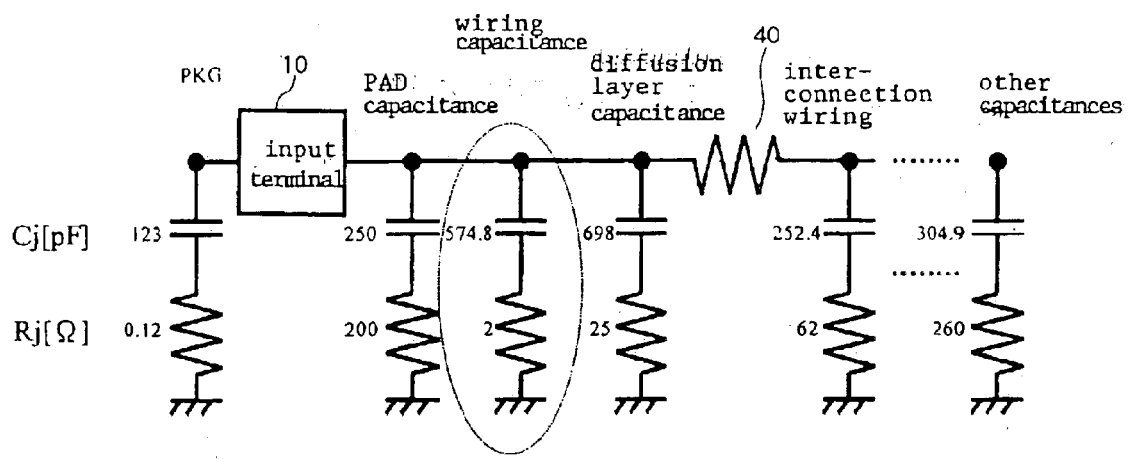
FIG. 2 is a diagram showing an equivalent circuit of the conventional semiconductor device illustrated in FIG. 1 after it has adjusted the input terminal capacitance.
Figure 3:
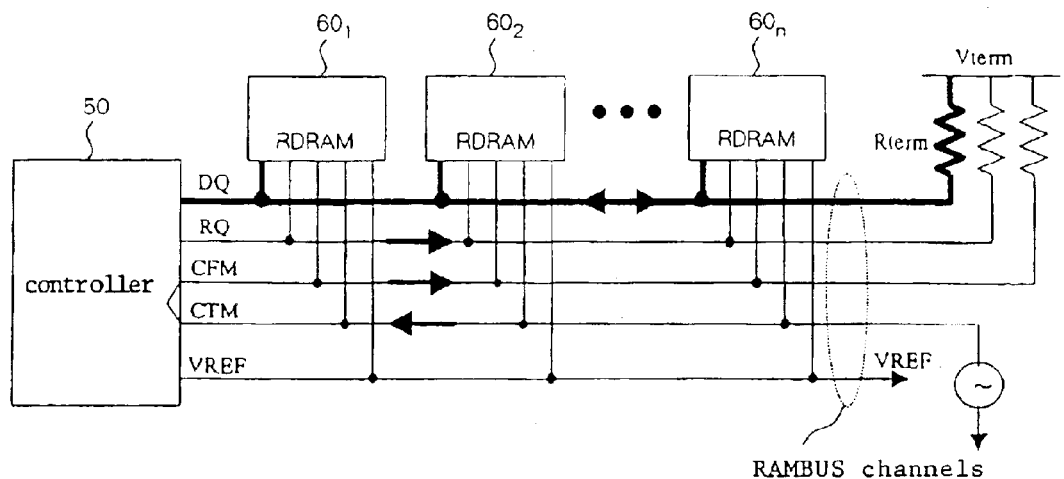
FIG. 3 is a diagram showing a typical arrangement of a system using RAMBUS DRAMs.
Figure 4:
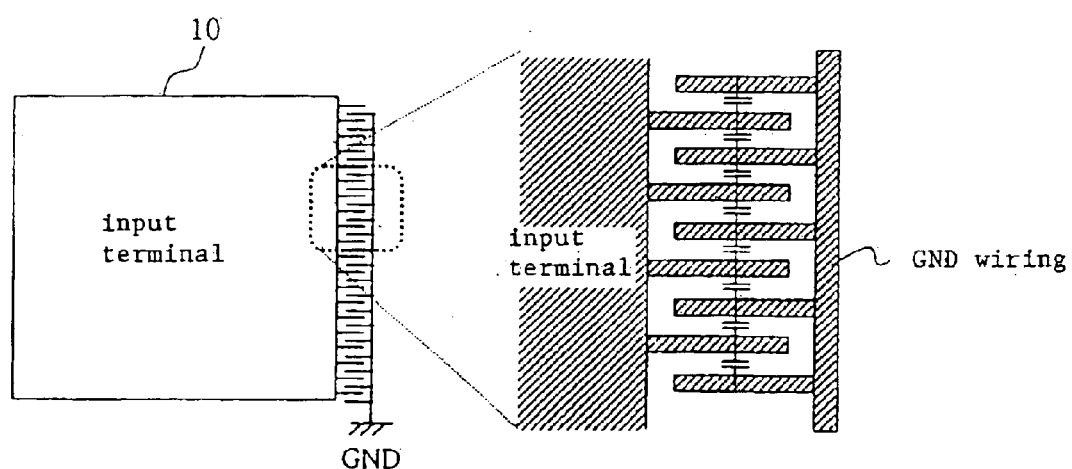
FIG. 4 is a plan view showing an arrangement of a semiconductor device having a capacitive component constructed using a comb-shaped wiring.

With the semiconductor device according to the first embodiment, input terminal capacitance (Ci) and input resistance (Ri) of input terminal (bonding pad) 10 are adjusted by comb-shaped wiring 14, capacitive wiring 13, and resistive wiring 11. The semiconductor device according to the first embodiment serves to adjust the wiring capacitance of the bonding pad (PAD) whose resistive components are small and also to adjust the resistive components in the equivalent circuit shown in FIG. 2.

Comb-shaped wiring 14 is formed around input terminal 10 at the same potential as input terminal 10, and is of a comb-shaped structure having cavities and fingers at constant spaced intervals. Capacitive wiring 13 is disposed in facing relation to comb-shaped wiring 14 therearound and has fingers positioned respectively in the cavities of comb-shaped wiring 14 in an interdigitating fashion. Resistive wiring 11 is made of a material having a high resistance, such as tungsten, polysilicon, or the like. Resistive wiring 11 is disposed underneath capacitive wiring 13 and connected to capacitive wiring 13 through a plurality of contacts 12 spaced at certain intervals. Resistive wiring 11 has ends connected to the ground potential.

Structural details of the semiconductor device according to the first embodiment will be described below. As shown in FIG. 5(a), comb-shaped wiring 14 having a potential which is the same potential as input terminal 10 and capacitive wiring 13 having a potential which is different from the potential of input terminal 10 are disposed around input terminal 10 in the same layer as input terminal 10 as equally spaced alternate fingers. The fingers of capacitive wiring 13 are interconnected by a common wiring around comb-shaped wiring 14 in the same layer as the fingers of capacitive wiring 13. As shown in FIG. 5(b), resistive wiring 11 is disposed underneath the common wiring of capacitive wiring 13 with an interlayer film 15 interposed therebetween. Capacitive wiring 13 and resistive wiring 1 1 are connected to each other by a plurality of contacts 12. Resistive wiring 11 is connected to the ground potential which serves as a fixed-potential power supply.

The semiconductor device according to the first embodiment allows the capacitance formed by capacitive wiring 13 and comb-shaped wiring 14 to be adjusted by changing the length of capacitive wiring 13, and also allows the resistance between capacitive wiring 13 and the ground potential to be adjusted by changing the positions of contacts 12 which interconnect capacitive wiring 13 and resistive wiring 11. Since the resistance between capacitive wiring 13 and the ground potential can be adjusted simply by changing the connections of contacts 12, only input resistance (Ri) can be adjusted without changing input terminal capacitance (Ci).

Figure 6:
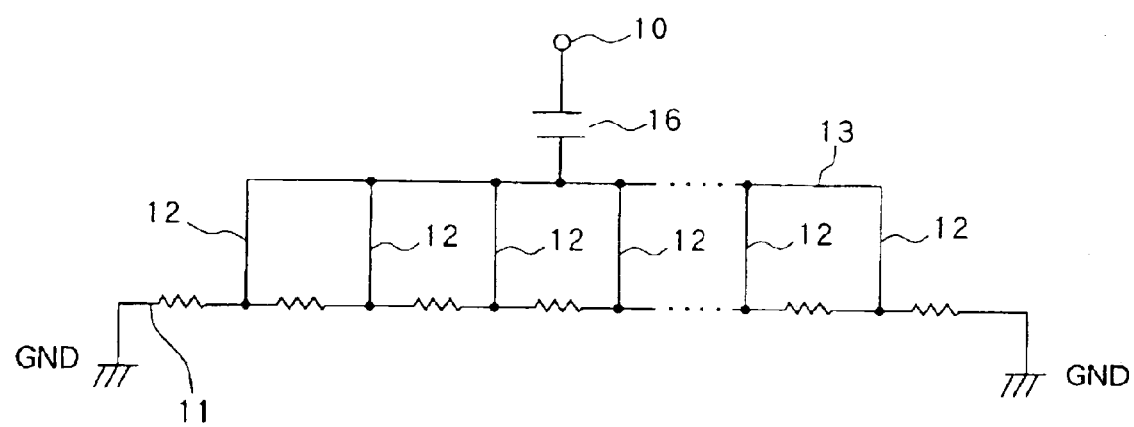
FIG. 6 is a diagram showing an equivalent circuit made up of various wirings of the semiconductor device according to the first embodiment of the present invention.

FIG. 6 shows an equivalent circuit made up of the various wirings of the semiconductor device according to the first embodiment shown in FIGS. 5(a) and 5(b).

In FIG. 6, capacitor 16 represents a capacitive component made up of comb-shaped wiring 14 and capacitive wiring 13 shown in FIGS. 5(a) and 5(b). As can be seen from FIG. 6, the resistance between capacitive wiring 13 and the ground potential can be adjusted by changing the positions of contacts 12.

Consequently, since the semiconductor device according to the first embodiment allows the value of input resistance (Ri) to be adjusted simply by changing the connections of contacts 12 (contact pattern), the semiconductor device can have its resistance adjusted without changing the capacitance of the pad.

Figure 7:
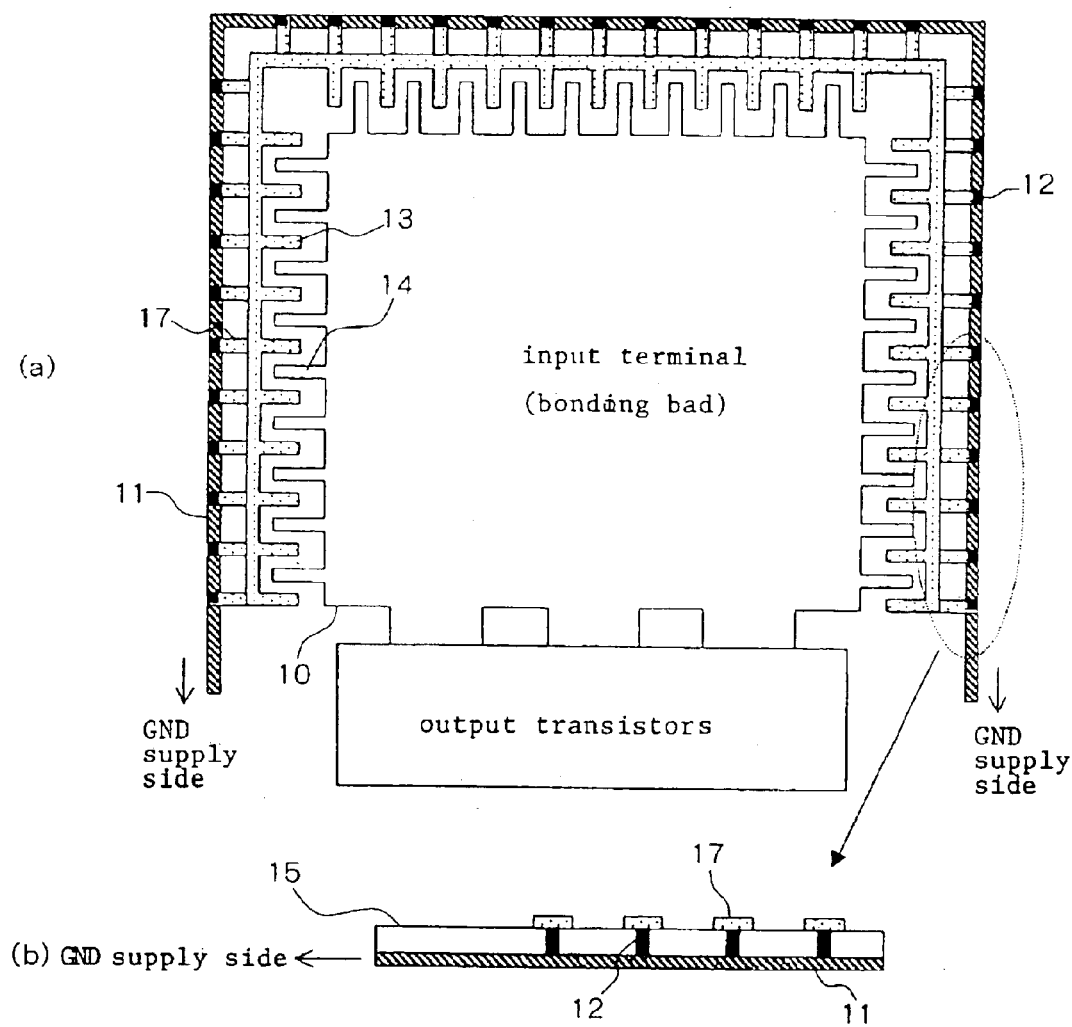
FIGS. 7(a) and 7(b) are views showing an wiring pattern of a semiconductor device according to a second embodiment of the present invention.

2nd Embodiment:

FIGS. 7(a) and 7(b) show an wiring pattern of a semiconductor device according to a second embodiment of the present invention. FIG. 7(a) is a plan view showing the wiring pattern of the semiconductor device, and FIG. 7(b) is a cross-sectional view of a portion, encircled by the broken line, of the semiconductor device shown in FIG. 7(a). Those parts of the semiconductor device according to the second embodiment shown in FIGS. 7(a) and 7(b) which are identical to those shown in FIGS. 5(a) and 5(b) are denoted by identical reference numerals, and will not be described in detail below.

According to the first embodiment, the contact pattern is changed to adjust the resistance. According to the second embodiment, the wiring pattern of an aluminum wiring is changed to adjust the resistance.

The structural details of capacitive wiring 13 and comb-shaped wiring 14 for adjusting the capacitance are identical to those shown in FIGS. 5(a) and 5(b), and will not be described in detail below. According to the second embodiment, resistive wiring 11 which is made of a material having a high resistance, such as tungsten, polysilicon, or the like is disposed in a lower layer outside of capacitive wiring 13, rather than directly underneath capacitive wiring 13. As with the first embodiment, resistive wiring 11 has ends connected to the ground potential. Resistive wiring 11 is connected to a layer including input terminal 10, comb-shaped wiring 14, and capacitive wiring 13 by contacts 12 that are spaced at constant intervals. Contacts 12 are connected to capacitive wiring 13 by joint wirings 17.

According to the second embodiment, the value of input resistance (Ri) can be adjusted simply by changing the wiring pattern of the aluminum wiring, as is the case with input terminal capacitance (Ci).

An equivalent circuit made up of the various wirings of the semiconductor device according to the second embodiment shown in FIGS. 7(a) and 7(b) is essentially the same as the equivalent circuit shown in FIG. 6, but differs therefrom only in that contacts 12 and capacitive wiring 13 are not directly interconnected, but are interconnected by joint wirings 17. The resistance between capacitive wiring 13 and the ground potential can be adjusted by changing the wiring pattern of the aluminum wiring to change the connected positions of joint wirings 17.

According to the first embodiment, it is necessary to change the aluminum wiring pattern and the contact pattern for adjusting the values of input terminal capacitance (Ci) and input resistance (Ri). According to the second embodiment, the values of both input terminal capacitance (Ci) and input resistance (Ri) can be adjusted simply by changing the aluminum wiring pattern. However, the semiconductor device according to the second embodiment takes up a larger area than the semiconductor device according to the first embodiment because resistive wiring 11 is disposed outside of capacitive wiring 13 according to the second embodiment.

In the first and second embodiments, the present invention is illustrated as being applied to a DRAM as a semiconductor device. However, the principles of the present invention are not limited to such an application, but are also applicable to any semiconductor devices other than the DRAMs insofar as they are required to adjust the input resistance and the input terminal capacitance between terminals.

Furthermore, the input terminal (bonding pad) is illustrated as being rectangular in shape and comb-shaped wiring 14 and capacitive wiring 13 are illustrated as being disposed in covering around relation to three sides of input terminal 10 according to the first and second embodiments. However, the principles of the present invention are not limited to such an application, but are also applicable to structures wherein only one side, or only two adjacent sides, or only two confronting sides are covered around by comb-shaped wiring 14 and capacitive wiring 13, or all four sides are covered around by comb-shaped wiring 14 and capacitive wiring 13.

While preferred embodiments of the present invention have been described using specific terms, such description is for illustrative purposes only, and it is to be understood that changes and variations may be made without departing from the spirit or scope of the following claims.

What is claimed is:

1. A semiconductor device having a plurality of input terminals, comprising:
    a comb-shaped wiring disposed around a bonding pad which serves as each of the input terminal, at the same potential as said bonding terminal, said comb-shaped wiring having cavities and fingers at constant spaced intervals;
    a capacitive wiring disposed in facing relation to said comb-shaped wiring and having fingers positioned respectively in said cavities of said comb-shaped wiring in an interdigitating fashion; and
    a resistive wiring disposed underneath said capacitive wiring and connected to said capacitive wiring by a plurality of contacts, said resistive wiring having ends connected to a ground potential.

2. A semiconductor device according to claim 1, wherein said bonding pad is rectangular in shape, and said comb-shaped wiring and said capacitive wiring are disposed in covering around relation to three sides of said bonding pad.

3. A semiconductor device having a plurality of input terminals, comprising:
    a comb-shaped wiring disposed around a bonding pad which serves as each of the input terminal, at the same potential as said bonding terminal, said comb-shaped wiring having cavities and fingers at constant spaced intervals;
    a capacitive wiring disposed in facing relation to said comb-shaped wiring and having fingers positioned respectively in said cavities of said comb-shaped wiring in an interdigitating fashion;
    a resistive wiring disposed in a lower layer outside of a position where said capacitive wiring is disposed, and connected by a plurality of contacts to a layer in which said bonding pad is disposed, said resistive wiring having ends connected to a ground potential; and
    joint wirings interconnecting said contacts and said capacitive wiring in said layer in which said bonding pad is disposed.

4. A semiconductor device according to claim 3, wherein said bonding pad is rectangular in shape, and said comb-shaped wiring and said capacitive wiring are disposed in covering around relation to three sides of said bonding pad.

* * * * *